US007187615B2

United States Patent
Park et al.

(10) Patent No.: US 7,187,615 B2
(45) Date of Patent: Mar. 6, 2007

(54) METHODS OF SELECTIVELY ACTIVATING WORD LINE SEGMENTS ENABLED BY ROW ADDRESSES AND SEMICONDUCTOR MEMORY DEVICES HAVING PARTIAL ACTIVATION COMMANDS OF WORD LINE

(75) Inventors: Min-Sang Park, Gyeonggi-do (KR); Yu-Lim Lee, Busan (KR); Seong-Jin Jang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 163 days.

(21) Appl. No.: 10/943,514

(22) Filed: Sep. 17, 2004

(65) Prior Publication Data

US 2005/0068840 A1 Mar. 31, 2005

(30) Foreign Application Priority Data

Sep. 26, 2003 (KR) ............... 10-2003-0066984

(51) Int. Cl.
*G11C 8/00* (2006.01)
(52) U.S. Cl. .................. 365/230.06; 365/191
(58) Field of Classification Search ............ 365/230.06
See application file for complete search history.

(56) References Cited

U.S. PATENT DOCUMENTS 5,978,304 A * 11/1999 Crafts ................ 365/230.03
2001/0049767 A1* 12/2001 Park et al. ................ 711/104

FOREIGN PATENT DOCUMENTS

JP 61-137296 6/1986

OTHER PUBLICATIONS

Notice to File a Response/Amendment to the Examination Report for Korean patent application No. 10-2003-0066984 mailed on Jul. 28, 2005.

* cited by examiner

*Primary Examiner*—Thong Q. Le
(74) *Attorney, Agent, or Firm*—Myers Bigel Sibley & Sajovec, PA

(57) ABSTRACT

A method for activating a word line segment of a semiconductor memory selected based on a row address provided to the memory can include activating a first word line segment selected by a row address and a command type and avoiding activating a second word line segment selected by the row address. Related devices are also disclosed.

19 Claims, 7 Drawing Sheets

METHODS OF SELECTIVELY ACTIVATING WORD LINE SEGMENTS ENABLED BY ROW ADDRESSES AND SEMICONDUCTOR MEMORY DEVICES HAVING PARTIAL ACTIVATION COMMANDS OF WORD LINE

CROSS-REFERENCE TO RELATED APPLICATION

This application claims the priority of Korean Patent Application No. 2003-66984 filed on Sep. 26, 2003, in the Korean Intellectual Property Office, the disclosure of which is incorporated herein by reference in its entirety.

FIELD OF THE INVENTION

The invention relates to memory devices, and more particularly, to word line decoding in memory devices.

BACKGROUND

Random Access Memory (RAM) can be generally classified as dynamic RAM (DRAM) or static RAM (SRAM). Since the SRAM may be more expensive (but faster) than a DRAM, an SRAM may be used as a fast small-sized external or internal cache memory device. The DRAM may be used as a general memory device that can operate at relatively slow speeds (compared to a cache memory device).

The DRAM is a volatile memory device that loses data when power is cut off. Also accumulated charges (used to store data) are reduced over time so that stored data may be lost even though power is maintained. Accordingly, it is known to periodically "refresh" the memory to maintain the stored data using a control circuit. Also, power consumption in DRAMs may be an important matter. Accordingly, it is known to reduce the amount of current to be consumed by the memory.

FIG. 1 is a block diagram of a conventional semiconductor memory device having a word line activation structure. Referring to FIG. 1, the DRAM includes a plurality of sub-memory cell arrays 40a, 40b, 40c and 40d. Each of the sub-memory cell arrays 40a, 40b, 40c and 40d includes a plurality of word lines (partially shown), a plurality of pairs of bit-lines (not shown) and a plurality of memory cells (not shown). The memory cells are positioned at intersections of the word lines and the bit lines. Sense amplifiers 50a, 50b, 50c and 50d are positioned between the sub-memory cell arrays 40a, 40b, 40c and 40d in parallel with the bit lines. The sense amplifiers 50a, 50b, 50c and 50d are shared by the adjacent sub-memory cell arrays 40a, 40b, 40c and 40d.

Referring still to FIG. 1, on both sides of each of the sub-memory cell arrays 40a, 40b, 40c and 40d, sub-word line drivers (SWDs) 30a, 30b and 30c are positioned in parallel with the word lines. Each of the SWDs 30a, 30b and 30c selects a corresponding word line in response to a main word line enable signal WLEj output from a main word line enable signal WLE generator 24 and a sub-word line enable signal PXi output from a sub-word line enable PXI generator 22. Conjunction regions 60a, 60b and 60c are positioned between the adjacent SWDs in parallel with the bit lines.

According to FIG. 1, if a row active command is applied and PX<0> and WLE <0> are selected by address decoding of a row decoder 20, the SWD 30a and the SWD 30c are enabled and the word line corresponding to the address provided is activated. Even though not shown in FIG. 1, if a row active command is applied and PX<0> and WLE <0> are enabled by the decoding of the row decoder 20, the SWD 30a, the SWD 30b and the SWD 30c are driven and the word line WL<0> corresponding to the address provided is activated. In FIG. 1, the word line is divided into two word line segments WL<0_1> and WL<0_2>. In operation, the two word line segments are simultaneously activated by the SWD 30a and the SWD 30c respectively.

As appreciated by the present inventors, the conventional semiconductor memory receives an address associated with a row active signal decoded by the command decoder, wherein the entire word line corresponding to the entire row address provided to the row decoder is activated. A portion of a word line of the semiconductor memory is activated and the sub-memory cell array activated in accordance with the word lines does not read or write data from or to all the sub-memory cell arrays. In other words, in FIG. 1, multiple sub-word line drivers may be activated even though the command to be carried out may require fewer sub-word line drivers to be activated. For example, AND2 and AND1 may both receive the signals needed to enable their respective outputs coupled to the different word line segments. Accordingly, all of the word line segments selected by a row address may be activated even though fewer may be sufficient to carry out the requested operation, thereby possibly increasing power consumption.

It is known to reduce unnecessary power consumption by activating only specific portions of the word line segments. In some conventional methods for activating only a specific portion of the word lines, a region of sense amplifier required to read and write data is set and only word lines corresponding to the "set" sense amplifier region are activated. This approach may require an additional address input to select the corresponding sense amplifier region. For example, if the sense amplifier region is divided into two regions and the word line is divided into two, one additional address may be required to select the appropriate sense amplifier region. If the sense amplifier region is divided into four regions and the word line region is divided into four, two additional addresses may be required. Accordingly, this method may be effective in reducing current, but may require additional address inputs. The addition of an address may require the addition of another address pin to the device and another signal line so that the design of a chip is further complicated. Furthermore, an additional refresh circuit may be required to refresh each of the divided word line regions.

Word line structures are also discussed, for example, in Korean Laid Open Patent Publication Nos. 10-2002-33883, 10-2002-84893, and 10-2002-36252.

SUMMARY

Embodiments according to the invention can provide methods of selectively activating word line segments enabled by row addresses and semiconductor memory devices having partial activation commands of word line. Pursuant to these embodiments, a method for activating a word line segment of a semiconductor memory selected based on a row address provided to the memory can include activating a first word line segment selected by a row address and a command type and avoiding activating a second word line segment selected by the row address.

In some embodiments according to the invention, the command type specifies an access to memory cells coupled to the first word line segment. In some embodiments according to the invention, the command type can be a partial activation command that specifies an access to memory cells coupled to the first word line segment. In some embodiments according to the invention, the partial activation command can be a first partial activation command for selecting the first word line segment and a second partial activation command for selecting the second word line segment.

In some embodiments according to the invention, the row address can be an entire row address that identifies memory cells to which the command type is directed. In some embodiments according to the invention, activating can include activating a first word line segment selected by a row address and a command type, and the command type can be based on a combination of /CS, /RAS, /CAS, and /WE signals.

In some embodiments according to the invention, avoiding activating a second word line segment selected by the row address can include avoiding activating the second word line segment if the command type comprises a partial activation command. The method can further include activating the second segment selected by the row address if the command type comprises a full activation command.

In some embodiments according to the invention, a method for activating a word line segment of a semiconductor memory selected based on a row address provided to the memory can include decoding command signals to provide a partial activation command for the memory, wherein the partial activation command selects one of a plurality of sub-word line drivers. A row address can be decoded to provide a write line enable signal to a plurality of sub-word line drivers coupled to a plurality of word line segments of the memory. One of the plurality of sub-word line drivers can be activated based on the write line enable signal and the partial activation commands.

In some embodiments according to the invention, decoding command signals can further include decoding the command signals to provide a full activation command for the memory, wherein the full activation command selects two or more of the plurality of sub-word line drivers.

In some embodiments according to the invention, a semiconductor memory device can include a command decoder circuit configured to generate a partial activation command to activate a first word line segment selected by a row address and a command type and configured to avoid activating a second word line segment selected by the row address.

In some embodiments according to the invention, a semiconductor memory device can include a memory cell array including a plurality of word lines respectively constructed with a plurality of word line segments. A decision circuit can decide whether an activation command is a partial activation command or not and can generate partial word line selection signals (Partial_1 and Partial_2) and an activation master signal PRD. Word line selection circuits can select one of the word lines in response to a row address signal and the activation master signal PRD, and can activate one of word line segments of the selected word line in response to the partial word line selection signals.

In some embodiments according to the invention, the word line selection circuit can include a decoder circuit configured to decode the row address in response to the activation master signal. A word line driver can be configured to select one of the word lines in response to the decoded address and all or selectively activating word line segments of the selected word line in response to the partial word line selection signals.

DETAILED DESCRIPTION OF EMBODIMENTS ACCORDING TO THE INVENTION

Figure 1:
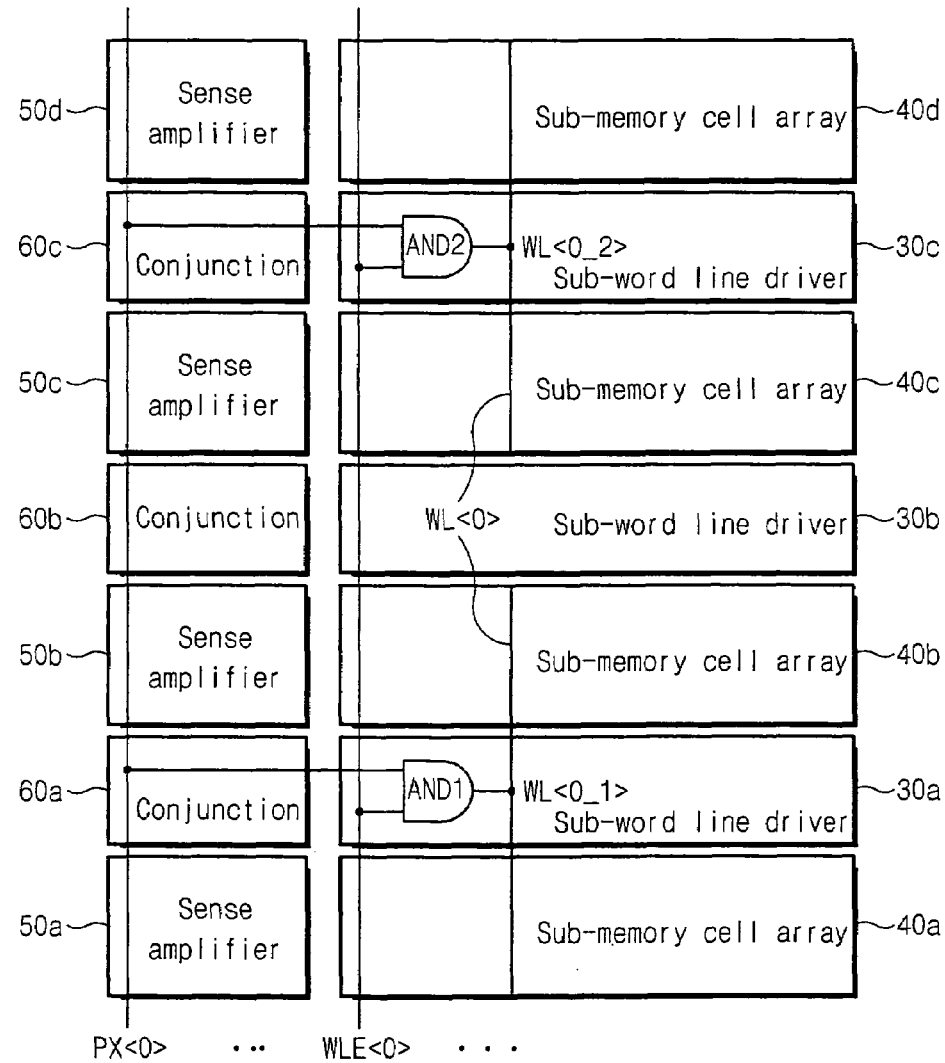
FIG. 1 is a block diagram of a general semiconductor memory device.
Figure 1:
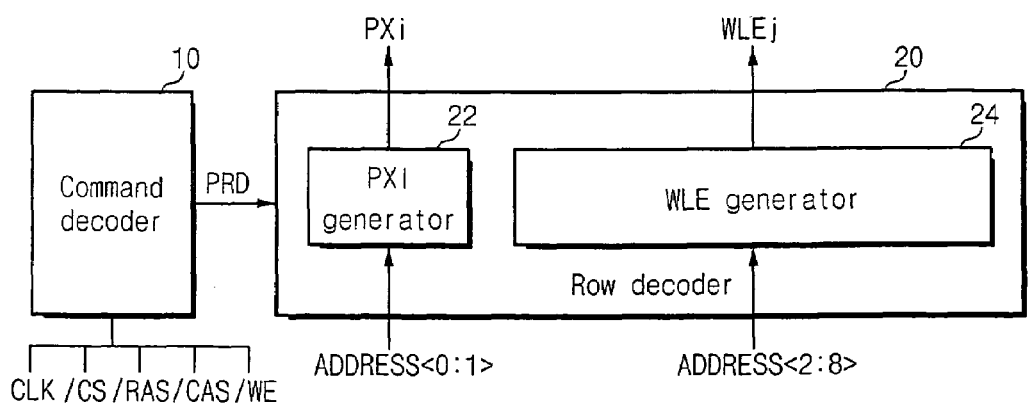

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or connected to the other element or intervening elements may be present. In contrast, when an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In some embodiments according to the invention, word lines are divided into two word line segments. In operation, a full activation command can be used to activate both word line segments, whereas a partial activation command can be used to activate one of the word line segments while the other word line segment remains idle.

Figure 2A:
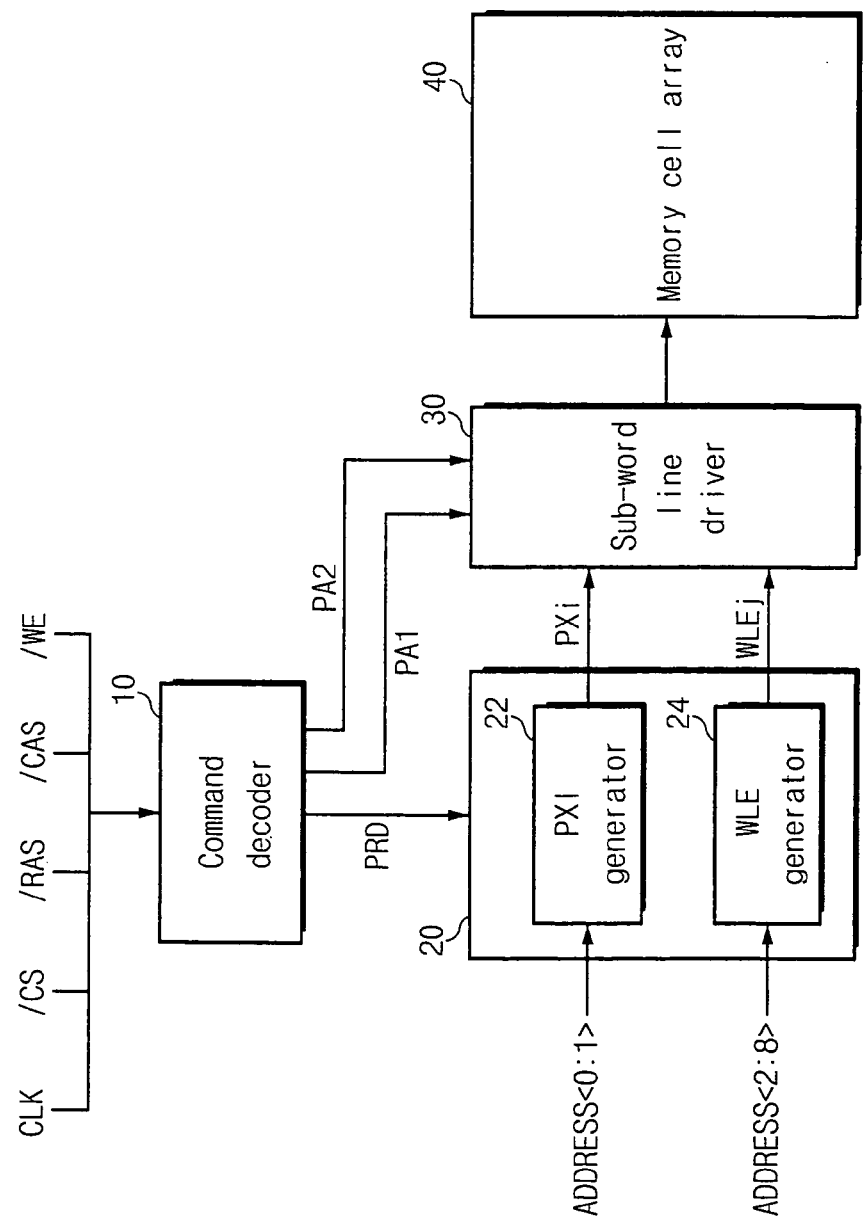
FIG. 2A is a block diagram of a semiconductor memory device having word line partial activation commands according to some embodiments of the invention.
Figure 2B:
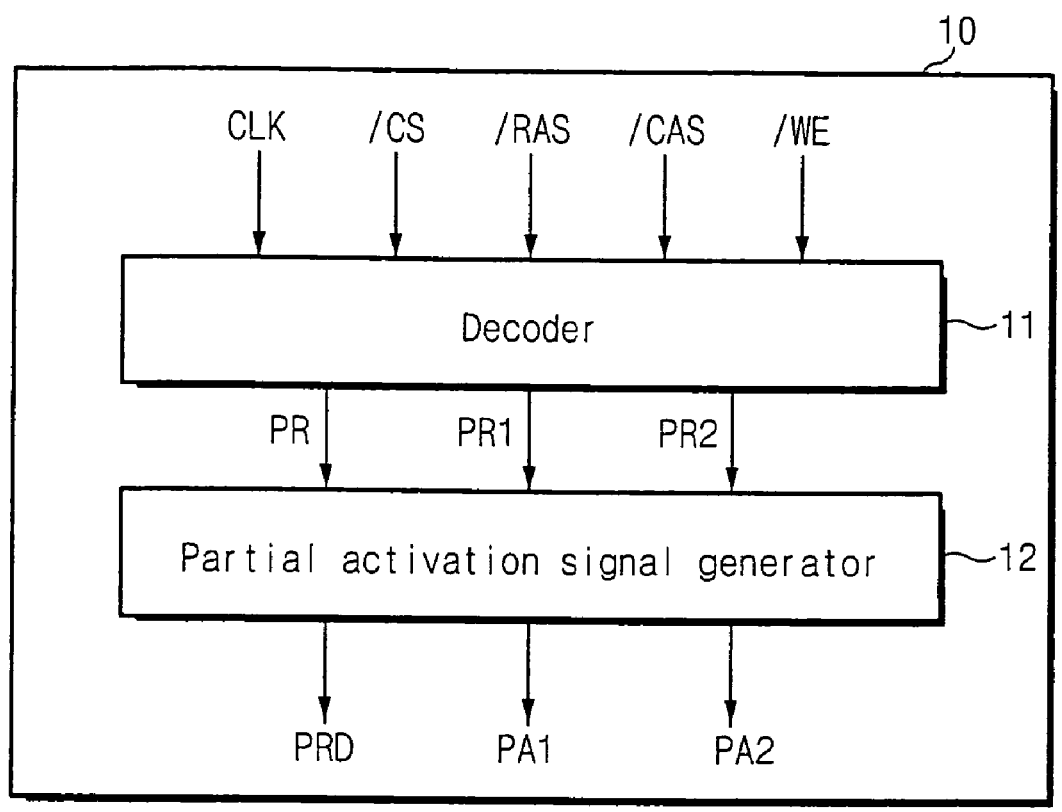
FIG. 2B is a block diagram of the command decoder circuit of FIG. 2A according to some embodiments of the invention.

FIG. 2A illustrates a semiconductor memory device according to some embodiments of the invention, supporting partial activation commands. Referring to FIG. 2A, the semiconductor memory device includes a command decoder 10, a row decoder 20, a sub-word line driver 30 and a memory cell array 40. FIG. 2B illustrates the command decoder 10 of FIG. 2A according to some embodiments of the invention.

Figure 3:
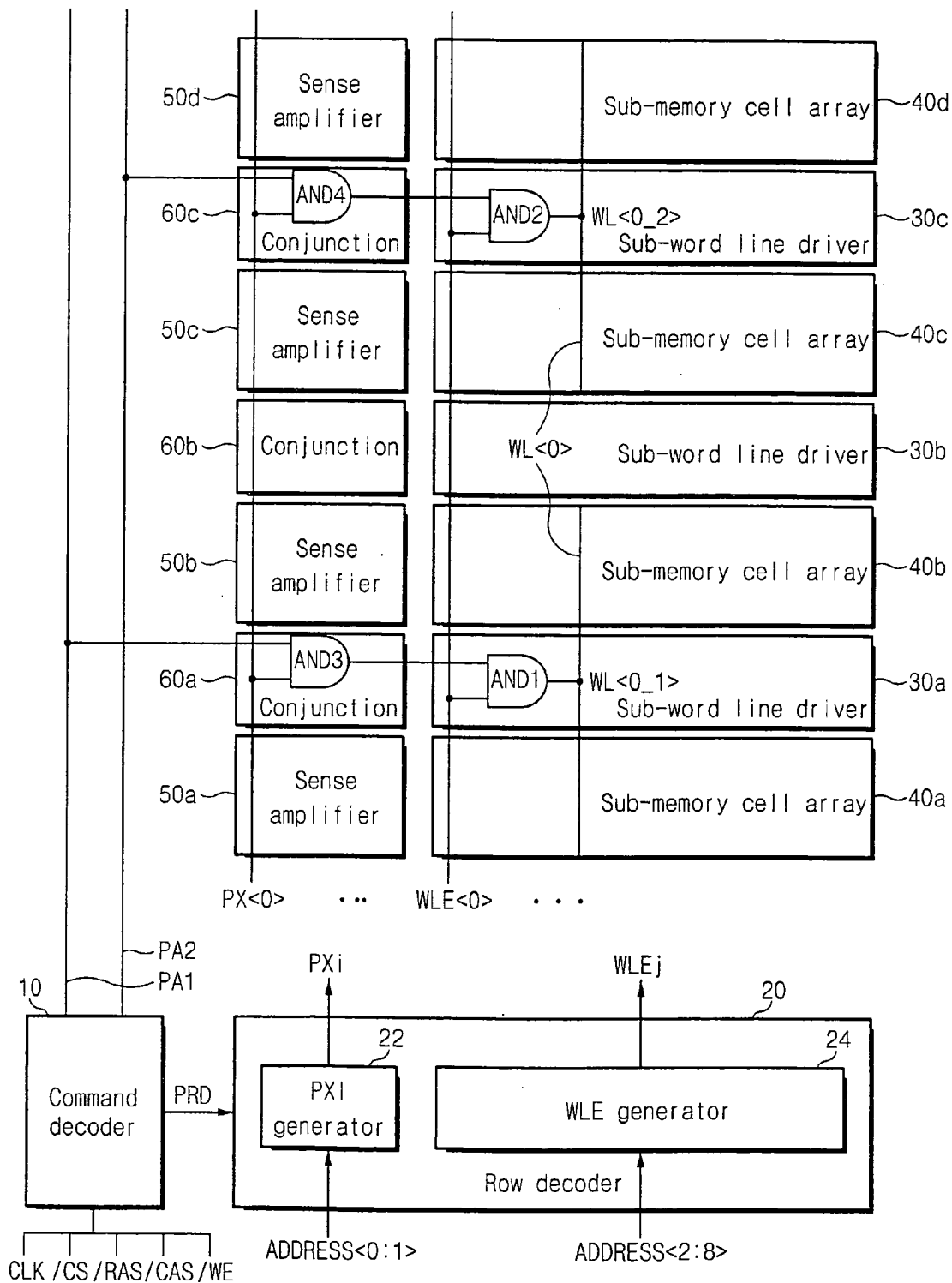
FIG. 3 is a block diagram of a semiconductor memory device having word line partial activation commands according to some embodiments of the invention.

As shown in FIG. 3, the memory cell array 40 includes sub-memory cell arrays 40a, 40b, 40c and 40d, the sub-word line driver 30 includes conjunction regions 60a, 60b and 60c as well as sub-word line drivers 30a, 30b and 30c and sense amplifiers 50a, 50b, 50c and 50d are disposed in the direction of the word line on the side of the sub-memory cell arrays 40a, 40b, 40c and 40d.

The command decoder 10 includes a decoder 11 and a partial activation signal generator 12 (or decision circuit). The decoder 11 receives a chip selection signal /CS, a row address strobe signal /RAS, a column address strobe signal /CAS and a write enable signal /WE, and decodes an entire segment selection command PR, a first segment selection command PR1 (or first word line segment signal) and a second segment selection command PR2 (or second word line segment signal). The partial activation signal generator 12 receives commands PR, PR1 and PR2 and outputs a word line activation signal PRD, a first partial activation signal PA1 and a second partial activation signal PA2.

In some embodiments according to the invention, the first partial activation signal PA1 can be used to activate only the first word line segment selected by a row address (while the second word line segment remains inactive). In some embodiments according to the invention, the second word line segment signal can be used to activate only the second word line segment selected by the row address (while the first word line segment remains inactive). In some embodiments according to the invention, the entire segment selection command PR can be used to activate both the first and second word line segments selected by the row address.

As described above, semiconductor memory devices according to some embodiments of the invention, can use a command for activating a portion of the word line as well as a command for activating the entire word line selected by the row decoder 20. In other words, the semiconductor memory device has a first segment selection command PRI for activating only one WL<0_1> of word line segments WL<0_1> and WL<0_2> of the word line WL<0> selected by address decoding and a second segment selection command PR2 for activating the remaining word line segment WL<0_2> in addition to an entire segment selection command PR for activating the entire word line WL<0> when the row decoder 20 decodes and selects the word line WL<0> corresponding to PX<0> and WLE<0>.

Figure 4A:
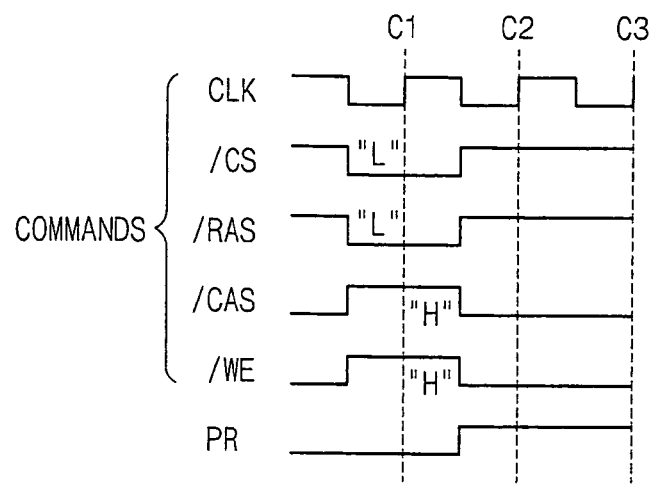
FIGS. 4A to 4C are timing diagrams that illustrate logic levels of signals /CS, /RAS, /CAS and /WE used to generate partial activation commands PR, PR1 and PR2 according to some embodiments of the invention.
Figure 4B:
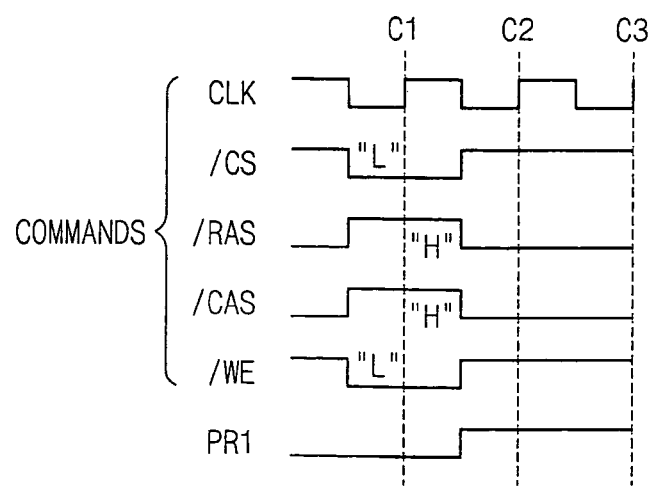
Figure 4C:
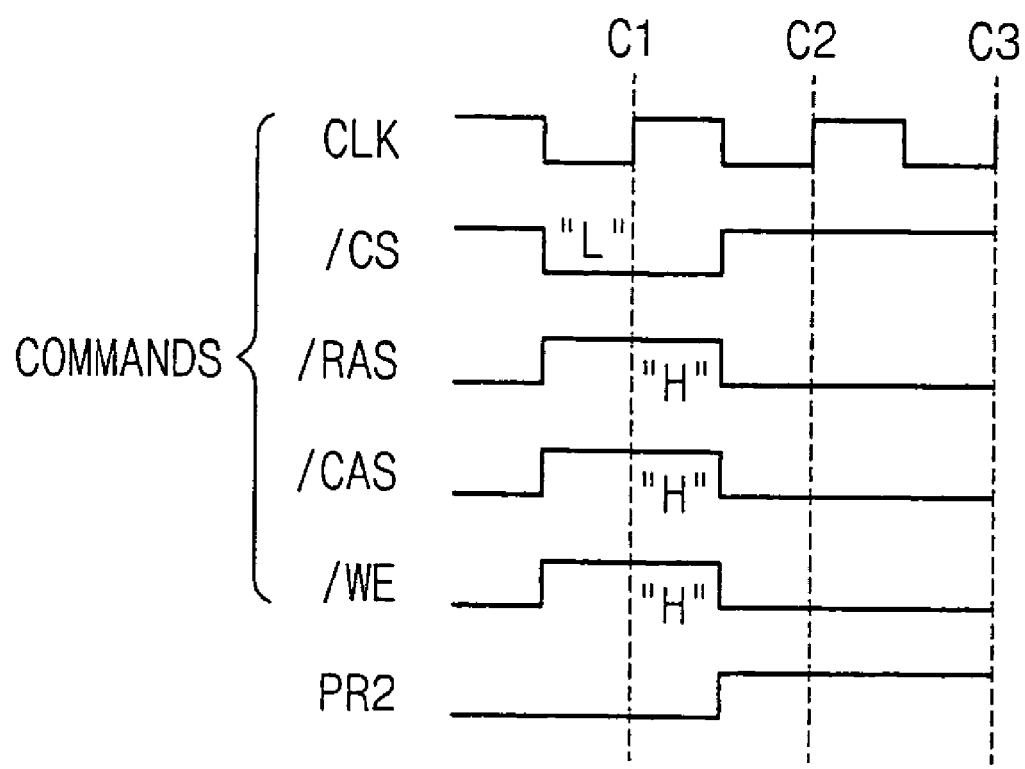

FIGS. 4A to 4C illustrate logic levels of signals /CS, /RAS, /CAS and /WE used to generate commands PR, PR1 and PR2 according to some embodiments of the invention. As shown in FIGS. 4A to 4C, the command PR is provided when the logic levels of /CS, /RAS, /CAS and /WE are low, low, high and high respectively. The first segment selection command PR1 is inputted when the logic levels of /CS, /RAS, /CAS and /WE are low, high, high and low respectively. The second segment selection command PR2 is provided when the logic levels of /CS, /RAS, /CAS and /WE are low, high, high and high respectively. It is determined whether to activate one or both of the word line segments WL<0_1> and WL<0_2> associated with the full word line WL<0> based on the commands PR, PR1 and PR2.

Figure 5:
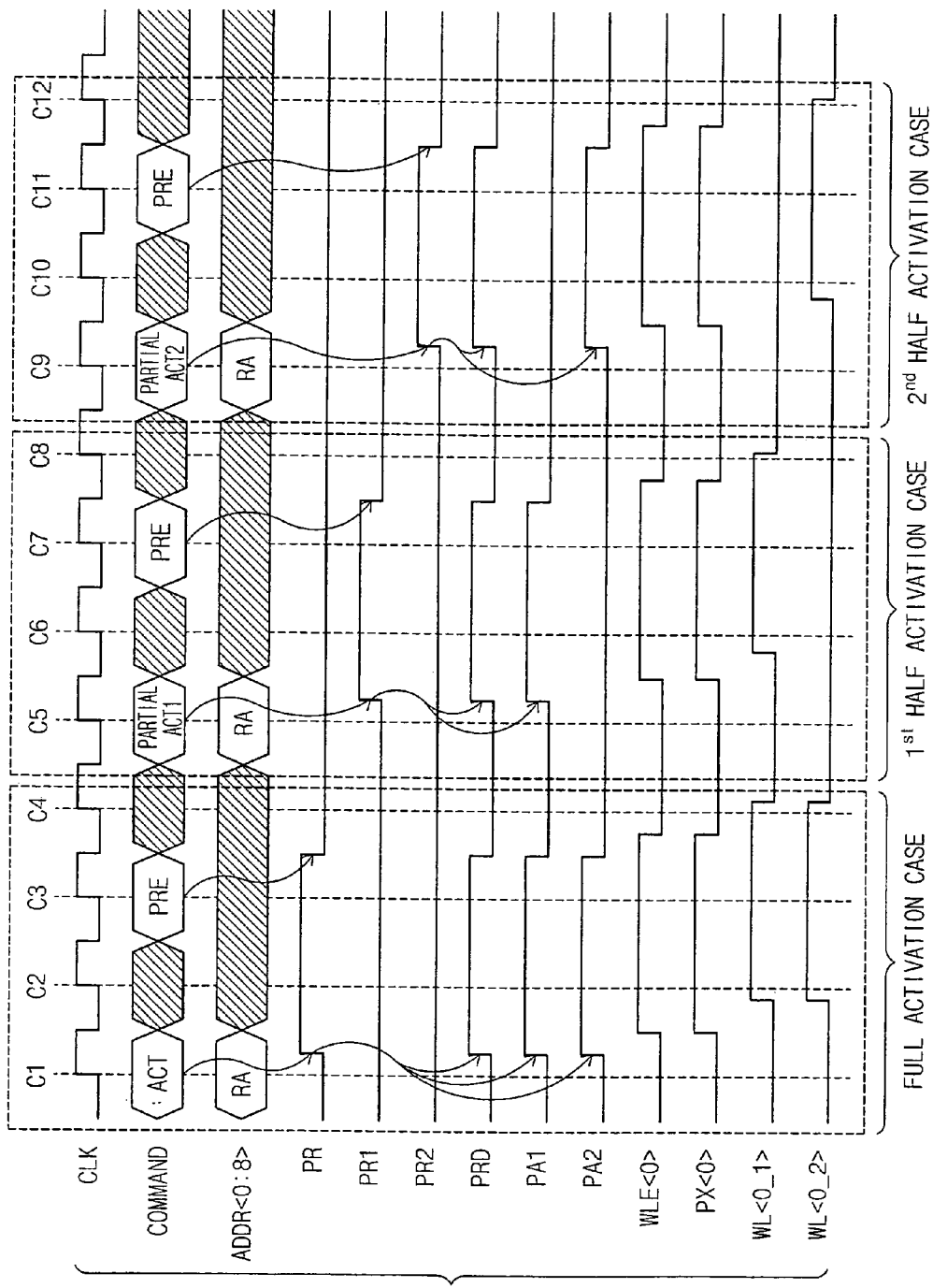
FIG. 5 is a timing diagram illustrating operations of semiconductor memory devices according to some embodiments of the invention.

FIG. 5 is a time chart illustrating operations of semiconductor memory devices according to some embodiments of the invention. An exemplary operation of the semiconductor memory where the entire segment selection command PR is provided with an address will be described in reference to FIGS. 2A through 5.

The decoder 11 outputs the entire segment selection command PR to the partial activation signal generator 12 when the logic levels of /CS, /RAS, /CAS and /WE are input to the command decoder 10 as low, low, high and high respectively. The partial activation signal generator 12 outputs an entire segment activation signal PRD, a first partial activation signal PA1 and a second partial activation signal PA2 at high levels.

The word line activation signal PRD is input to the row decoder 20, and the first partial activation signal PA1 and the second partial activation signal PA2 are input to the word line driver 30. The row decoder 20 selects a corresponding word line based on the address by providing a signal WLEj output from the WLE generator and a signal PXi output from the PXI generator.

Referring to FIG. 3, a word line WL<0> (selected by PX<0> and WLE<0>) is enabled so that the word line segment WL<0_1> and the word line segment WL<0_2> are activated. The word line word line segment WL<0_1> and the word line segment WL<0_2> are both activated since the first partial activation signal PA1 and the second partial activation signal PA2 are both at high levels, which are output from the command decoder 10 to the word line driver 30.

An exemplary operation of the semiconductor memory where the first segment selection command PR1 is provided with an address is described as follows. The decoder 11 outputs the first segment selection command PR1 to the partial activation signal generator 12 when the logic levels of /CS, /RAS, /CAS and /WE are input to the command decoder 10 as low, high, high and low respectively. The partial activation signal generator 12 outputs the word line activation signal PRD and the first partial activation signal PA1 at high levels and the second partial activation signal PA2 at a low level.

The row decoder 20 selects a corresponding word line WL<0> based on the address provided thereto in response to the signal WLE<0> (WLEj) output from the WLE generator and a signal PX<0> (Pxi) output from the PXI generator. The word line word line segment WL<0_1> is activated, whereas the word line segment WL<0_2> is not activated since the first partial activation signal PA1 and the second partial activation signal PA2 are at a high level and a low level respectively. The signals are output from the command decoder 10 to the word line driver 30.

An exemplary operation of the semiconductor memory where the second segment selection command PR2 is provided with an address is described as follows. The decoder 11 outputs the second segment command PR2 to the partial activation signal generator 12 when the logic levels of /CS, /RAS, /CAS and /WE are input to the command decoder 10 as low, high, high and high respectively. The partial activation signal generator 12 outputs the word line activation signal PRD and the second partial activation signal PA2 at a high level and the first partial activation signal PA1 at a low level.

The row decoder 20 selects a corresponding word line WL<0> based on the address in response to the signal WLE<0> (WLEj) output from the WLE generator and the signal PX<0> (Pxi) output from the PXI generator. The word line segment WL<0_2> is activated whereas the word line segment WL<0_1> is not activated since the first partial activation signal PA1 and the second partial activation signal PA2 are at a low level and a high level respectively, which are output from the command decoder 10 and input to the word line driver 30.

In some embodiments according to the invention, the semiconductor memory device applies the word line activation methods described herein to provide general refresh operations to for memory. In other words, the memory cells connected with the word line selected by the row address is simultaneously refreshed so that data stored in the memory device are not lost and the memory device is stably operated.

As described above, according to some embodiments of the invention, a portion of the word lines corresponding to a received row address are activated, which may allow the consumption current of the semiconductor memory device to be reduced. Especially, the activation region of the word line can be selected by a command, which may reduce the need for the addition of pins. Furthermore, the word line can be partially activated and no additional circuit is required to simultaneously refresh the entire word line in refresh operation and the circuit becomes simple.

It will be apparent to those skilled in the art that various modifications and variations can be made in the invention. Thus, it is intended that the invention covers the modifications and variations of this invention provided they come within the scope of the appended claims and their equivalents.

What is claimed:

1. A method for activating a word line segment of a semiconductor memory selected based on a row address provided to the memory comprising:
   activating a first word line segment selected by a row address and a command type and avoiding activating a second word line segment selected by the row address, wherein the command type comprises a partial activation command that specifies an access to memory cells coupled to the first word line segment.

2. A method according to claim 1 wherein the command type specifies an access to memory cells coupled to the first word line segment.

3. A method according to claim 1 wherein the partial activation command comprises a first partial activation command for selecting the first word line segment and a second partial activation command for selecting the second word line segment.

4. A method according to claim 1 wherein the row address comprises an entire row address that identifies memory cells to which the command type is directed.

5. A method according to claim 1 wherein activating comprises activating a first word line segment selected by a row address and a command type, wherein the command type is based on a combination of /CS, /RAS, /CAS, and /WE signals.

6. A method according to claim 5 wherein avoiding activating a second word line segment selected by the row address comprises avoiding activating the second word line segment if the command type comprises a partial activation command; and wherein the method further comprises:
   activating the second segment selected by the row address if the command type comprises a full activation command.

7. A method for activating a word line segment of a semiconductor memory selected based on a row address provided to the memory comprising:
   decoding command signals to provide a partial activation command for the memory, wherein the partial activation command selects one of a plurality of sub-word line drivers;
   decoding a row address to provide a write line enable signal to the plurality of sub-word line drivers coupled to a plurality of word line segments of the memory; and
   activating one of the plurality of sub-word line drivers based on the write line enable signal and the partial activation commands.

8. A method according to claim 7 wherein decoding command signals further comprises:
   decoding the command signals to provide a full activation command for the memory, wherein the full activation command selects two or more of the plurality of sub-word line drivers.

9. A method according to claim 7 wherein the row address comprises an entire row address that identifies memory cells to which a command is directed.

10. A method according to claim 7 wherein the partial activation command is based on a combination of /CS, /RAS, /CAS, and /WE signals.

11. A semiconductor memory device comprising:
    a command decoder circuit configured to generate a partial activation command to activate a first word line segment selected by a row address and a command type and configured to avoid activating a second word line segment selected by the row address.

12. A memory device according to claim 11 wherein the row address comprises an entire row address that identifies memory cells to which the command type is directed.

13. A memory device according to claim 11 wherein the command decoder is configured to generate the partial activation command based on a combination of /CS, /RAS, /CAS, and /WE signals.

14. A memory device according to claim 11 wherein the partial activation command comprises a first partial activation command for activating the first word line segment and a second partial activation command for activating the second word line segment.

15. A memory device according to claim 11 wherein the command decoder is configured to generate a full activation command for activating the first and second word line segments based on a combination of /CS, /RAS, /CAS, and /WE signals.

16. A semiconductor memory device comprising:
    a memory cell array including a plurality of word lines respectively constructed with a plurality of word line segments;
    a decision circuit for deciding whether an activation command is a partial activation command or not and generating partial word line selection signals (Partial$_1$ and Partial_2) and an activation master signal PRD; and
    word line selection circuits for selecting one of the word lines in response to a row address signal and the activation master signal PRD, and activating one of word line segments of the selected word line in response to the partial word line selection signals.

17. A semiconductor memory device according to claim 16 wherein the word line selection circuit comprises:

a decoder configured to decode the row address in response to the activation master signal; and a word line driver configured to select one of the word lines in response to the decoded address and all or selectively activating word line segments of the selected word line in response to the partial word line selection signals.

18. A semiconductor memory device according to claim 16 wherein the decision circuit comprises:

a decoder circuit configured to decode logic levels of control signals in response to a transition of a clock signal and thereby generating first to third flag signals; and a decision circuit configured to generate the activation master signal and the partial word line selection signals in response to the first to third flag signals.

19. A semiconductor memory device according to claim 18 wherein the activation master signal becomes activated when the combination of the control signals comprises the activation command, and wherein the partial word line selection signals are selectively activated when the activation command is a partial activation command.

* * * * *

UNITED STATES PATENT AND TRADEMARK OFFICE
CERTIFICATE OF CORRECTION

| | | |
|---|---|---|
| PATENT NO. | : 7,187,615 B2 | |
| APPLICATION NO. | : 10/943514 | |
| DATED | : March 6, 2007 | |
| INVENTOR(S) | : Park et al. | |

It is certified that error appears in the above-identified patent and that said Letters Patent is hereby corrected as shown below:

<u>Column 8,</u>

Line 58-59: Please correct "(Partial_$_1$ and Partial _2)"
             To read --(Partial_1 and Partial_2)--

Signed and Sealed this

Twenty-ninth Day of May, 2007

JON W. DUDAS
*Director of the United States Patent and Trademark Office*